United States Patent
Zhu et al.

(10) Patent No.: US 12,137,595 B2
(45) Date of Patent: Nov. 5, 2024

(54) DISPLAY MODULE AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Zhijian Zhu, Beijing (CN); Pengcheng Lu, Beijing (CN); Wei Liu, Beijing (CN); Rongfei Chen, Beijing (CN); Shengji Yang, Beijing (CN); Kuanta Huang, Beijing (CN); Xiaochuan Chen, Beijing (CN)

(73) Assignees: YUNNAN INVENSIGHT OPTOELECTRONICS TECHNOLOGY CO., LTD., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/565,900

(22) PCT Filed: Oct. 29, 2021

(86) PCT No.: PCT/CN2021/127510
§ 371 (c)(1),
(2) Date: Nov. 30, 2023

(87) PCT Pub. No.: WO2023/070542
PCT Pub. Date: May 4, 2023

(65) Prior Publication Data
US 2024/0268179 A1  Aug. 8, 2024

(51) Int. Cl.
*H10K 59/38* (2023.01)
*G09G 3/3208* (2016.01)

(52) U.S. Cl.
CPC .......... *H10K 59/38* (2023.02); *G09G 3/3208* (2013.01); *G09G 2300/0426* (2013.01); *G09G 2300/0452* (2013.01)

(58) Field of Classification Search
CPC ................. H10K 59/38; G09G 3/3208; G09G 2300/0452
See application file for complete search history.

(56) References Cited

U.S. PATENT DOCUMENTS 7,331,286 B2   2/2008  Baek et al.
9,704,930 B2   7/2017  Wang et al.
(Continued)

FOREIGN PATENT DOCUMENTS

CN   103107180 A   5/2013
CN   103336629 A   10/2013
(Continued)

OTHER PUBLICATIONS

International Search Report of application No. PCT/CN2021/127510 dated May 27, 2022.
(Continued)

*Primary Examiner* — Mariceli Santiago
(74) *Attorney, Agent, or Firm* — Calfee, Halter & Griswold LLP

(57) ABSTRACT

The present invention relates to a display assembly and a display device including the same. The display assembly includes a backplane, a plurality of light-emitting units and a plurality of color filter modules. The light-emitting units are provided on a side of the backplane, and the color filter modules are provided on a side of the light-emitting units away from the backplane. The color filter module includes a plurality of filter units of different colors. From a center of the display assembly to an edge of the display assembly, adjacent filter units of a same kind have different widths.

20 Claims, 3 Drawing Sheets

(56) References Cited

U.S. PATENT DOCUMENTS

| | | |
|---|---|---|
| 2004/0126678 A1 | 7/2004 | Baek et al. |
| 2016/0300888 A1 | 10/2016 | Wang et al. |
| 2022/0140007 A1* | 5/2022 | Yan .................... H10K 50/865 |
| | | 257/89 |

FOREIGN PATENT DOCUMENTS

| | | | |
|---|---|---|---|
| CN | 103996696 A | | 8/2014 |
| CN | 103107180 B | | 1/2016 |
| CN | 103336629 B | | 5/2016 |
| CN | 108153033 A | | 6/2018 |
| CN | 110350015 A | | 10/2019 |
| CN | 110379835 A | | 10/2019 |
| CN | 110596901 A | | 12/2019 |
| CN | 110806655 A | | 2/2020 |
| CN | 111025660 A | | 4/2020 |
| CN | 210803871 U | | 6/2020 |
| CN | 111799393 A | | 10/2020 |
| CN | 113140603 A | | 7/2021 |
| CN | 116648091 A | * | 8/2023 |
| CN | 116887638 A | * | 10/2023 |
| CN | 117580409 A | * | 2/2024 |
| WO | WO-2022236845 A1 | * | 11/2022 ............. G09F 9/301 |

OTHER PUBLICATIONS

Written Opinion of application No. PCT/CN2021/127510 dated May 27, 2022.

* cited by examiner

DISPLAY MODULE AND DISPLAY DEVICE

CROSS-REFERENCE TO RELATED APPLICATIONS

The present application is a US. National Stage of International Application No. PCT/CN2021/127510 filed on Oct. 29, 2021.

TECHNICAL FIELD

The present disclosure relates to the field of display technology, and specifically to a display assembly and a display device.

BACKGROUND

Micro organic light-emitting diode (Micro OLED) display devices combine white light-emitting layer (EL) and a color filter (CF) layer to achieve color display. The color filter (CF) layer passes a corresponding wavelength of monochromatic light by absorbing specific wavelengths of light.

Currently, Micro OLED display assemblies based on stacked OLED elements have the problem of color deviation at a large viewing angle, i.e., as the angle at which the display assembly is viewed becomes larger, the color of the display assembly changes. If the difference between colors at different positions or different light-emitting angles is large, the display effect is poor.

It is to be noted that the above information disclosed in the Background section is only for enhancement of understanding of the background of the present disclosure and therefore it may contain information that does not form the prior art that is already known to a person skilled in the art.

SUMMARY

Embodiments of the present disclosure provide a display assembly and a display device.

An aspect of the present disclosure provides a display assembly, including: a backplane; a plurality of light-emitting units, provided on a side of the backplane; and a plurality of color filter modules, provided on a side of the plurality of light-emitting units away from the backplane, the color filter module including a plurality of filter units of different colors, wherein from a center of the display assembly to an edge of the display assembly, adjacent filter units of a same kind have different widths.

In an embodiment of the present disclosure, the plurality of filter units includes a first filter unit, a second filter unit and a third filter unit, and in a cross-section perpendicular to the display assembly, widths of the first filter units gradually decrease from the center of the display assembly to the edge of the display assembly, widths of the second filter units gradually increase from the center of the display assembly to the edge of the display assembly, and widths of the third filter units gradually increase from the center of the display assembly to the edge of the display assembly.

In an embodiment of the present disclosure, the plurality of filter units includes a first filter unit, a second filter unit and a third filter unit, and in a cross-section perpendicular to the display assembly, widths of the first filter units gradually decrease from the center of the display assembly to the edge of the display assembly, widths of the second filter units remain constant from the center of the display assembly to the edge of the display assembly, and widths of the third filter units remain constant from the center of the display assembly to the edge of the display assembly.

In an embodiment of the present disclosure, the plurality of filter units includes a first filter unit, a second filter unit and a third filter unit, and in a cross-section perpendicular to the display assembly, widths of the first filter units remain constant from the center of the display assembly to the edge of the display assembly, widths of the second filter units gradually increase from the center of the display assembly to the edge of the display assembly, and widths of the third filter units gradually increase from the center of the display assembly to the edge of the display assembly.

In an embodiment of the present disclosure, the widths of the first filter units located at the edge and between the edge and the center are $$W_{R1} = \frac{(r_1 + g_1 + b_1)\, r}{(r + g + b)\, r_1} W_R;$$

the widths of the second filter units located at the edge and between the edge and the center are $$W_{G1} = \frac{(r_1 + g_1 + b_1)\, g}{(r + g + b)\, g_1} W_G;$$

the widths of the third filter units located at the edge and between the edge and the center are $$W_{B1} = \frac{(r_1 + g_1 + b_1)\, b}{(r + g + b)\, b_1} W_B,$$

where $W_R$ is the width of the first filter unit located at the center, $W_G$ is the width of the second filter unit located at the center, $W_B$ is the width of the third filter unit located at the center, r is a luminance of light of a first color with a 0° light-emitting angle at the center, g is a luminance of light of a second color with the 0° light-emitting angle at the center, b is a luminance of light of a third color with the 0° light-emitting angle at the center, $W_{R1}$ is the width of the first filter unit located at the edge, $W_{G1}$ is the width of the second light filter unit located at the edge, $W_{B1}$ is the width of the second filter unit located at the edge, $r_1$ is the luminance of light of the first color with a light-emitting angle at the edge and between the edge and the center, $g_1$ is the luminance of light of the second color with the light-emitting angle at the edge and between the edge and the center, and $b_1$ is the luminance of light of the third color with the light-emitting angle at the edge and between the edge and the center.

In an embodiment of the present disclosure, the width of the first filter unit at a position between the edge and the center is $$W_{R1} = W_R - \frac{2X}{L} \times 2b,$$

where X is a distance from the position to the center in a first direction, L is a width of the display assembly in the first direction, and b is half of a difference between the width of the first filter unit located at the edge and the width of the first filter unit located at the center.

In an embodiment of the present disclosure, the width of the second filter unit at a position between the edge and the center is $$W_{G1} = W_G + \frac{2X}{L} \times 2b;$$

the width of the third filter unit at the position between the edge and the center is $$W_{B1} = W_B + \frac{2X}{L} \times 2b,$$

where X is a distance from the position to the center in a first direction, L is a width of the display assembly in the first direction, and b is half of a difference between the width of the first filter unit located at the edge and the width of the first filter unit located at the center.

In an embodiment of the present disclosure, the light-emitting unit includes a first electrode, a light-emitting layer and a second electrode, the first electrode is provided on a side of the backplane, the light-emitting layer is provided on a side of the first electrode away from the backplane, the second electrode is provided on a side of the light-emitting layer away from the backplane, the backplane includes a plurality of switching units, and the switching unit is connected to the first electrode.

In an embodiment of the present disclosure, a plurality of the light-emitting units includes a plurality of first electrodes, an orthographic projection of the first filter unit on the backplane and orthographic projections of the plurality of first electrodes on the backplane form a first overlapping portion, and widths of the first overlapping portions remain constant from the center of the display assembly to the edge of the display assembly, orthographic projections, on the backplane, of the second filter unit and the third filter unit and the orthographic projections of the plurality of first electrodes on the backplane form a second overlapping portion, and widths of the second overlapping portions gradually increase from the center of the display assembly to the edge of the display assembly.

In an embodiment of the present disclosure, the display assembly further includes: a plurality of converging lenses, provided on a side of the plurality of color filter modules away from the backplane, each of the converging lens corresponding to one of the filter units, and an orthographic projection of the filter unit on the backplane being located within an orthographic projection of a corresponding converging lens on the backplane.

In an embodiment of the present disclosure, orthographic projections, on the backplane, of the converging lenses corresponding to the first filter units gradually decrease from the center of the display assembly to the edge of the display assembly, orthographic projections, on the backplane, of the converging lenses corresponding to the second filter units gradually increase from the center of the display assembly to the edge of the display assembly, and orthographic projections, on the backplane, of the converging lenses corresponding to the third filter units gradually increase from the center of the display assembly to the edge of the display assembly.

In an embodiment of the present disclosure, orthographic projections, on the backplane, of the converging lenses corresponding to the first filter units, the second filter units and the third filter units remain constant from the center of the display assembly to the edge of the display assembly.

In an embodiment of the present disclosure, arch heights of the converging lenses corresponding to different filter units are same.

In an embodiment of the present disclosure, a region at the edge of the display assembly and between the edge of the display assembly and the center of the display assembly is a changing region, and wherein an orthographic projection, on the backplane, of a center of the filter unit in the changing region is not overlapped with an orthographic projection, on the backplane, of a center of the first electrode.

In an embodiment of the present disclosure, a region at the edge of the display assembly and between the edge of the display assembly and the center of the display assembly is a changing region, and wherein an orthographic projection, on the backplane, of a center of the condensing lens in the changing region is not overlapped with an orthographic projection, on the backplane, of a center of the first electrode.

In an embodiment of the present disclosure, the first filter unit, the second filter unit and the third filter unit, which are adjacent to each other, form one pixel, and wherein in a cross-section perpendicular to the display assembly, a total width of a plurality of the pixels is constant.

In an embodiment of the present disclosure, the first filter unit is a red film, the second filter unit is a green film, and the third filter unit is a blue film.

In an embodiment of the present disclosure, the backplane is a monocrystalline silicon integrated circuit.

Another aspect of the present disclosure provides a display device, including the display assembly according to an aspect of the present disclosure and an optical system, light-emitting angles and luminance at different positions of the display assembly match requirements of the optical system for the light-emitting angle and the luminance.

In an embodiment of the present disclosure, the display device is used for an AR device or a VR device.

It should be understood that the above general description and the detailed descriptions that follow are only exemplary and explanatory and do not limit the present disclosure.

BRIEF DESCRIPTION OF THE DRAWINGS

The accompanying drawings herein are incorporated into and form a part of the specification, illustrate embodiments consistent with the present disclosure, and serve to, in conjunction with the specification, explain the principle of the present disclosure. Obviously, the accompanying drawings in the following description are only some of the embodiments of the present disclosure, and other accompanying drawings may be obtained from these drawings without creative work by those skilled in the art.

DETAILED DESCRIPTION

Figure 1:
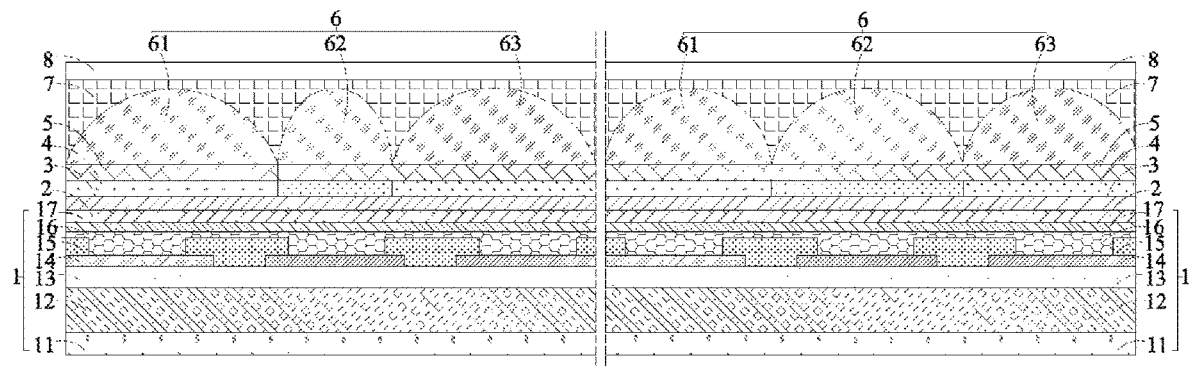
FIG. 1 shows a cross-sectional structural view of a display assembly in an embodiment of the present disclosure.

Example embodiments will now be described more fully with reference to the accompanying drawings. However, the example embodiments can be implemented in a variety of forms and should not be construed as being limited to the embodiments set forth herein. Rather, these embodiments are provided so that the present disclosure is comprehensive and complete and the concept of the example embodiments is conveyed to those skilled in the art comprehensively. The same reference numerals in accompanying drawings denote the same or similar structures, and thus their detailed descriptions will be omitted. In addition, the accompanying drawings are only schematic illustrations of the present disclosure and are not necessarily drawn to scale.

Although relativity terms such as "on" and "below" are used in this specification to describe the relative relationship of one component to another component as shown in the figures, these terms are used in the specification only for convenience of description, e.g., based on the example direction described in the accompanying drawings. It will be appreciated that if the device shown is flipped to be upside down, the component described as being "on" will become the component described as being "below". When a structure is "on" another structure, it may mean that the structure is integrally formed on the other structure, or that the structure is "directly" provided on the other structure, or that the structure is "indirectly" provided on the other structure via an additional structure.

The terms "a", "an", "the", "said" and "at least one" are used to indicate the presence of one or more elements/components/etc.; the terms "including" and "having" are used to indicate open-ended inclusion and mean that there may be additional elements/components/etc. in addition to those listed; and the terms "first", "second", "third", etc. are used only as markers and are not intended to limit be the quantity of objects thereof.

In recent years, the augmented reality (AR)/virtual reality (VR) technology becomes mature and gets more and more attention in the consumer market and manufacturing industry. A Micro organic light-emitting diode (Micro OLED) display assembly uses a monocrystalline silicon (monosilicon) integrated circuit as a backplane and a top light-emitting OLED (Organic Light Emitted Transistor) element as the source of light. The Micro OLED display assembly has advantages such small size, light weight, high contrast, fast response speed, low power consumption, which is expected to become the next generation mobile display terminal.

At present, the Micro OELD combines a white light-emitting layer and a color filter (CF) layer to achieve color display. The color filter (CF) layer passes red, blue or green monochrome light by absorbing specific wavelengths of light. If the transmittance rate of the color filter layer is $\tau$, the aperture ratio (AR) thereof is $\alpha$, and the luminance of white light emitted by the OLED element is L, the luminance $L_{CF}$ that can be felt by the human eye through the color filter (CF) layer is $\tau*\alpha*L$.

The color filter (CF) layer passes "monochrome light" by absorbing specific wavelengths of light, therefore the luminance of white light emitted by the OLED element after passing the color filter layer will be greatly reduced. The Micro OLED display technology has problems such as low luminance and short lifetime of OLED element, which limits the application thereof in the field of AR/VR.

Angle customization can match the light-emitting angles and luminance of different positions of the display assembly with the light-emitting angle and luminance requirements of the optical system of the AR/VR display device, so as to achieve a better display effect. The most notable effect is that the imaging luminance can be more uniform, thus improving the quality of imaging.

At the same time, the optical system also has requirements on the color difference between different positions and different light-emitting angles of the display assembly. If the color difference between different positions or different light-emitting angles is large, the imaging display effect is poor. The current Micro OLED display assembly has a small color difference between different positions, generally less than 2 JNCD, but the color difference between different angles at the same position of the display assembly is large, which will significantly affect the display effect.

The Micro OLED display assembly based on stacked OLED elements has the problem of color deviation at a large viewing angle, i.e., as the angle at which the display assembly is viewed becomes larger, the color of the display assembly changes. The degree of color change at different viewing angles can be characterized by V'U'V'. In the field of AR and VR applications, V'U'V' at the main viewing angle should be less than or equal to 0.008. The chief ray angle at the center of the display assembly is 0°, at which there is generally no color difference. Therefore, the color difference of the entire display assembly may be eliminated by adjusting the color difference between the light-emitting angles at the other positions of the display assembly and the 0° light-emitting angle at the center of the display assembly.

As shown in FIGS. 1 to 6, an embodiment of the present disclosure provides a display assembly that can eliminate color deviation. The display assembly includes a backplane 12, a plurality of light-emitting units, and a plurality of color filter modules 40. The plurality of light-emitting units are provided on a side of the backplane 12, the plurality of color filter modules 40 are provided on a side of the light-emitting units away from the backplane 12. The color filter module 40 includes a plurality of filter units of different colors. For widths of the plurality of filter units, from the center of the display assembly to the edge of the display assembly, adjacent filter units of a same kind have different widths.

The widths of the plurality of filter units gradually changes from the center of the display assembly to the edge of the display assembly, so that the ratios of light of different colors of light at different positions of the display assembly are consistent, which ensures that the color coordinate of the mixed light with a specific light-emitting angle at that position is the same as that with the 0° light-emitting angle at the center of the display assembly, therefore the color difference at the specific light-emitting angle at that position and the 0° light-emitting angle at the center of the display assembly can theoretically be zero. The color difference at different light-emitting angles of the display assembly is eliminated, and the imaging display effect is better.

It should be noted that the center of the display panel here refers to the geometric center point of the display panel, and the edge refers to the geometric boundary of the display panel.

The Micro OELD display assembly is described in detail below as an example.

Figure 2:
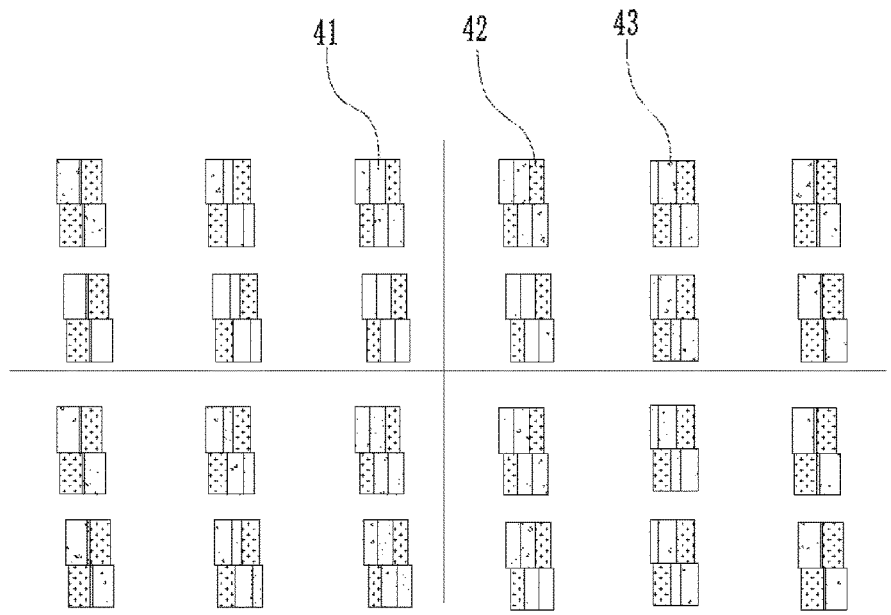
FIG. 2 shows a top view of a color filter layer in an embodiment of the present disclosure.
Figure 3:
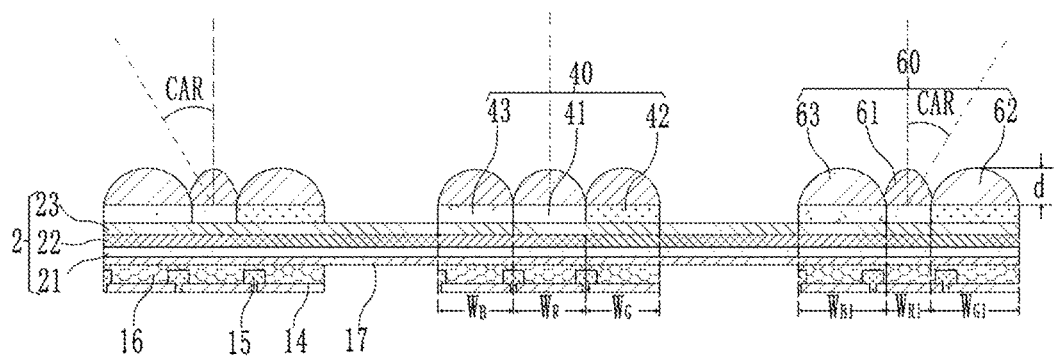
FIG. 3 shows a cross-sectional structural view of a light-emitting layer, a thin-film encapsulation layer, and a micro-lens layer in an embodiment of the present disclosure.

As shown in FIGS. 1 to 3, the display assembly includes a display panel 1, the display panel 1 includes a base substrate 11 and a backplane 12, the backplane 12 includes a plurality of switching units, and the plurality of switching units are arranged in an array on a side of the base substrate 11. A first planarization layer 13 is provided on a side of the backplane 12 is away from the base substrate 11, and a plurality of light-emitting units are provided on a side of the first planarization layer 13 away from the base substrate 11. The light-emitting unit includes a first electrode 14, a light-emitting layer 16, and a second electrode 17, the first electrode 14 is provided on a side of the backplane 12, the light-emitting layer 16 is provided on a side of the first electrode 14 away from the backplane 12, and the second electrode 17 is provided on a side of the light-emitting layer 16 away from the backplane 12. The backplane 12 includes a plurality of switching units, the switching unit is connected to the first electrode 14, a pixel-defining layer 15 is provided on a side of the first electrode 14 away from the base substrate 11 to cover the first planarization layer 13 and partially cover the first electrode 14, the light-emitting layer 16 is provided on a surface of the first electrode 14 away from the base substrate 11 and is located between adjacent pixel-defining portions, and the second electrode 17 is provided on a surface of the light-emitting layer 16 away from the base substrate 11. The light-emitting layer 16 may be driven to emit light by the first electrode 14 and the second electrode 17 to display an image.

The second electrode 17 may be used as a cathode, and the first electrode 14 may be used as an anode. The light-emitting layer may be driven to emit light by applying a signal to the first electrode 14, and the specific light-emitting principle will not be described in detail herein. The light-emitting layer may include an electroluminescent organic light-emitting material, and may be formed by a process such as vapor deposition. For example, the light-emitting layer may include a hole injection layer, a hole transport layer, a light generation layer, an electron transport layer, and an electron injection layer sequentially stacked on the first electrode 14.

Since the second electrode 17 is generally Mg or Ag, which is sensitive to $H_2O$ and $O_2$, and thus may be easily oxidized, a thin-film encapsulation layer 2 is provided to isolate the OLED element from water and oxygen, which has the effect of protecting the OLED device. Therefore, the display assembly of the present disclosure may also include the thin film encapsulation layer 2, and the thin-film encapsulation layer 2 may be provided on a side of the second electrode 17 away from the base substrate 11, so as to encapsulate the light-emitting layer 16 and prevent the same from water-oxygen erosion. The thin-film encapsulation layer 2 may be a single layer or a multilayer structure, and the material thereof may include an organic or inorganic material, for example, the thin-film encapsulation layer 2 may include a silicon nitride dielectric layer 21, an aluminium oxide inorganic layer 22, and a poly-p-xylylene thin film 23.

The display assembly disclosed may also include a second planarization layer 3, a color filter layer 4, a third planarization layer 5, a micro-lens layer 6, an adhesive layer 7, and a cover plate 8. The second planarization layer 3 is provided on a side of the thin-film encapsulation layer 2 away from the base substrate 11, the color filter layer 4 is provided on a side of the second planarization layer 3 away from the base substrate 11, the third planarization layer 5 is provided on a side of the color filter layer 4 away from the base substrate 11, the micro-lens layer 6 is provided on a side of the third planarization layer 5 away from the base substrate 11, the adhesive layer 7 is provided on a side of the micro-lens layer 6 away from the base substrate 11, and the cover plate 8 is provided on a side of the adhesive layer 7 away from the base substrate 11.

The color filter layer 4 as shown includes a plurality of color filter modules 40, and the color filter module 40 includes a first filter unit 41, a second filter unit 42 and a third filter unit 43 of different colors. The first filter unit 41 may be a red film, the second filter unit 42 may be a green film, and the third filter unit 43 may be a blue film. The first filter unit 41, second filter unit 42 and third filter unit 43, which are adjacent to each other, form one pixel, and in the cross-section perpendicular to the display assembly, the total width of the plurality of pixels is constant.

The orthographic projection of the light-emitting unit on the backplane 12 is overlapped with the orthographic projection of the filter unit on the backplane 12. The plurality of light-emitting units includes a first light-emitting unit, a second light-emitting unit, and a third light-emitting unit. The orthographic projection of the first light-emitting unit on the backplane 12 is overlapped with the orthographic projection of the first light filter unit 41 on the backplane 12, the orthographic projection of the second light-emitting unit on the backplane 12 is overlapped with the orthographic projection of the second light filter unit 42 on the backplane 12, and the orthographic projection of the third light-emitting unit on the backplane 12 is overlapped with the orthographic projection of the third light filter unit 43 on the backplane 12.

The plurality of light-emitting units includes a plurality of first electrodes 14. The orthographic projection of the first filter unit 41 on the backplane 12 and the orthographic projections of the plurality of first electrodes 14 on the backplane 12 form a first overlapping portion, and the widths of the first overlapping portions remain constant from the center of the display assembly to the edge of the display assembly. The orthographic projections, on the backplane 12, of the second filter unit 42 and the third filter unit 43 and the orthographic projections of the plurality of first electrodes 14 on the backplane 12 form a second overlapping portion, and widths of the second overlapping portions gradually increase from the center of the display assembly to the edge of the display assembly.

As can be seen, the first overlapping portion includes only a partial orthographic projection of one first electrode 14 on the backplane 12, and the second overlapping portion includes the orthographic projection of one first electrode 14 on the backplane 12 and a partial orthographic projection of another first electrode 14 on the backplane 12. It is to be understood that the light emitted from only a portion of the light-emitting region of one light-emitting unit passes the first filter unit 41, and the second filter unit 42 and the third filter unit 43 correspond to one complete light-emitting unit and a portion of the light-emitting region of another light-emitting unit, which thus can improve the display color difference at different positions of the display assembly.

The left side in FIG. 1 shows the edge of the display assembly and the right side thereof shows the center of the display assembly. As can be seen from FIG. 1, the widths of the first filter unit 41, the second filter unit 42 and the third filter unit 43 located at the center of the display assembly are the same. The width of the first filter unit 41 located at the edge of the display assembly is smaller than the width of the first filter unit 41 located at the center of the display assembly, the width of the second filter unit 42 located at the edge of the display assembly is smaller than the width of the second filter unit 42 located at the center of the display assembly, and the width of the third filter unit 43 located at the edge of the display assembly is smaller than the width of the third filter unit 43 located at the center of the display assembly.

As can be seen from FIG. 2, in a cross-section perpendicular to the display assembly, the width of the first filter unit 41, the width of the second filter unit 42, and the width of the third filter unit 43 gradually change from the center of the display assembly to the edge of the display assembly, so that the ratio of the tricolor light with a certain light-emitting angle at a different position between the edge and the center is the same as that of the tricolor light with a 0° light-emitting angle at the center.

It is to be understood that in order to achieve a consistent ratio of the tricolor light at different positions between the edge and the center of the display assembly, the width of one of the first filter unit 41, the second filter unit 42 and the third filter unit 43 may be adjusted separately, and the widths of the remaining two filter units may be adaptively adjusted. It is also possible to simultaneously adjust the widths of two of the first filter unit 41, the second filter unit 42, and the third filter unit 43, and then adaptively change the width of the remaining one filter unit. It is also possible to directly set the width of the first filter unit 41, the width of the second filter unit 42, and the width of the third filter unit 43. It may be processed flexibly according to the color deviation of the display assembly.

An example is illustrated below. As shown in FIG. 2, if the Micro OLED shows redder at a large viewing angle, i.e., the red light is stronger at the large viewing angle. For example, when the light-emitting angle is 0°, the RGB luminance is 500/800/60, and when the light-emitting angle is 60°, the RGB luminance is 200/80/6, therefore the ratio of the red, green, and blue light in the mixed white light is imbalanced, and the mixed light is redder.

At this time, the widths of the first filter units 41 may be adjusted to gradually decrease from the center of the display assembly to the edge of the display assembly, the widths of the second filter units 42 may be adjusted to gradually increase from the center of the display assembly to the edge of the display assembly, and the widths of the third filter units 43 may be adjusted to gradually increase from the center of the display assembly to the edge of the display assembly.

It is also possible to adjust the widths of the first filter units 41 to gradually decrease from the center of the display assembly to the edge of the display assembly, the widths of the second filter units 42 to remain constant from the center of the display assembly to the edge of the display assembly, and the widths of the third filter units 43 to remain constant from the center of the display assembly to the edge of the display assembly.

It is also possible to adjust the widths of the first filter units 41 to remain constant from the center of the display assembly to the edge of the display assembly, the widths of the second filter units 42 to gradually increase from the center of the display assembly to the edge of the display assembly, and the widths of the third filter units 43 to gradually increase from the center of the display assembly to the edge of the display assembly.

By reducing the width of the first filter unit 41 and/or increasing the width of the second filter unit 42 and the width of the third filter unit 43, the problem where the mixed light is redder may be reduced or eliminated.

If the Micro OLED shows greener at a large viewing angle, i.e., the green light is stronger at the large viewing angle. For example, when the light-emitting angle is 0°, the RGB luminance is 500/800/60, and when the light-emitting angle is 60°, the RGB luminance is 50/200/6, therefore the ratio of the red, green, and blue light in the mixed white light is imbalanced, and the mixed light is greener.

At this time, the widths of the first filter units 41 may be adjusted to gradually increase from the center of the display assembly to the edge of the display assembly, the widths of the second filter units 42 may be adjusted to gradually decrease from the center of the display assembly to the edge of the display assembly, and the widths of the third filter units 43 may be adjusted to gradually increase from the center of the display assembly to the edge of the display assembly.

Similarly, it is also possible to adjust the widths of the first filter units 41 to remain constant from the center of the display assembly to the edge of the display assembly, the widths of the second filter units 42 to decrease from the center of the display assembly to the edge of the display assembly, and the widths of the third filter units 43 to remain constant from the center of the display assembly to the edge of the display assembly.

Similarly, it is also possible to adjust the widths of the first filter units 41 to gradually increase from the center of the display assembly to the edge of the display assembly, the widths of the second filter units 42 to remain constant from the center of the display assembly to the edge of the display assembly, and the widths of the third filter units 43 to gradually increase from the center of the display assembly to the edge of the display assembly.

By reducing the width of the second filter unit 42 and/or increasing the width of the first filter unit 41 and the width of the third filter unit 43, the problem where the mixed light is greener may be reduced or eliminated.

If the Micro OLED shows bluer at a large viewing angle, i.e., the blue light is stronger at the large viewing angle. For example, when the light-emitting angle is 0°, the RGB luminance is 500/800/60, and when the light-emitting angle is 60°, the RGB luminance is 50/80/30, therefore the ratio of the red, green, and blue light in the mixed white light is imbalanced, and the mixed light is bluer.

At this time, the widths of the first filter units 41 may be adjusted to gradually increase from the center of the display assembly to the edge of the display assembly, the widths of the second filter units 42 may be adjusted to gradually increase from the center of the display assembly to the edge of the display assembly, and the widths of the third filter units 43 may be adjusted to gradually decrease from the center of the display assembly to the edge of the display assembly.

Similarly, it is also possible to adjust the widths of the first filter units 41 to remain constant from the center of the display assembly to the edge of the display assembly, the widths of the second filter units 42 to remain constant from the center of the display assembly to the edge of the display assembly, and the widths of the third filter units 43 to gradually decrease from the center of the display assembly to the edge of the display assembly.

Similarly, it is also possible to adjust the widths of the first filter units 41 to gradually increase from the center of the display assembly to the edge of the display assembly, the widths of the second filter units 42 to gradually increase from the center of the display assembly to the edge of the display assembly, and the widths of the third filter units 43 to remain constant from the center of the display assembly to the edge of the display assembly.

By reducing the width of the third filter unit 43 and/or increasing the width of the first filter unit 41 and the width of the second filter unit 42, the problem where the mixed light is bluer may be reduced or eliminated.

By adjusting the ratio of the tricolor light at different positions of the display assembly, the ratio of the tricolor light with a certain light-emitting angle at a certain position between the edge and the center may be the same as the ratio of the tricolor light with the 0° light-emitting angle at the center, which ensures that the color coordinate of the mixed light with a specific light-emitting angle at that position is the same as that with the 0° light-emitting angle at the center of the display assembly, therefore the color difference at the specific light-emitting angle at that position and the 0° light-emitting angle at the center of the display assembly can theoretically be zero.

As shown in FIG. 3, in order to ensure the accuracy of the adjustment, the ratio of the tricolor light at different positions of the display assembly is finely adjusted. The dimension of the first filter unit 41 at the edge of the display assembly and the dimension of the first filter unit 41 at the center of the display assembly, the dimension of the second filter unit 42 at the edge of the display assembly and the dimension of the second filter unit 42 at the center of the display assembly, and the dimension of the third filter unit 43 at the edge of the display assembly and the dimension of the third filter unit 43 at the center of the display assembly should satisfy the following relationships:

the widths of the first filter units 41 located at the edge and between the edge and the center are $$W_{R1} = \frac{(r_1 + g_1 + b_1)_r}{(r + g + b)_{r1}} W_R;$$

the widths of the second filter units 42 located at the edge and between the edge and the center are $$W_{G1} = \frac{(r_1 + g_1 + b_1)_g}{(r + g + b)_{g1}} W_G;$$

the widths of the third filter units 43 located at the edge and between the edge and the center are $$W_{B1} = \frac{(r_1 + g_1 + b_1)_b}{(r + g + b)_{b1}} W_B,$$

where $W_R$ is the width of the first filter unit 41 located at the center, $W_G$ is the width of the second filter unit 42 located at the center, $W_B$ is the width of the third filter unit 43 located at the center, r is a luminance of light of a first color with a 0° light-emitting angle at the center, g is a luminance of light of a second color with the 0° light-emitting angle at the center, b is a luminance of light of a third color with the 0° light-emitting angle at the center, $W_{R1}$ is the width of the first filter unit 41 located at the edge, $W_{G1}$ is the width of the second light filter unit 42 located at the edge, $W_{B1}$ is the width of the second filter unit 42 located at the edge, $r_1$ is the luminance of light of the first color with a light-emitting angle at the edge and between the edge and the center, $g_1$ is the luminance of light of the second color with the light-emitting angle at the edge and between the edge and the center, and $b_1$ is the luminance of light of the third color with the light-emitting angle at the edge and between the edge and the center.

If the ratio of red, green and blue light with 0° is 3:8:1, and the ratio of red, green and blue light with 30° is 5:8:1, the display assembly shows redder at a large viewing angle. Then, in order to ensure that the ratio of red, green and blue light with 30° is 3:8:1 at the edge of the display assembly, at this time:

$$\frac{3}{12} W_R = \frac{5}{14} W_{R1},$$

then $$W_{R1} = \frac{7}{10} W_R;$$

$$\frac{8}{12} W_G = \frac{8}{14} W_{G1},$$

then $$W_{G1} = \frac{7}{6} W_G;$$

$$\frac{1}{12} W_B = \frac{1}{14} W_{B1},$$

then $$W_{B1} = \frac{7}{6} W_B.$$

It can be understood that the above formula requires the ratio of the tricolor light with different light-emitting angles of the display assembly, and it is more inconvenient to calculate the dimensions of the first filter unit 41, the second filter unit 42, and the third filter unit 43 at different light-emitting angles of the display assembly.

Figure 4:
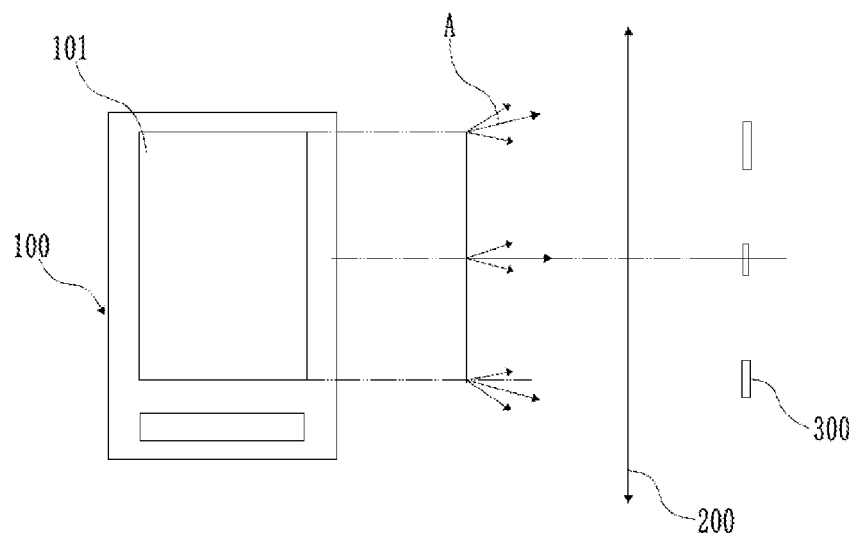
FIG. 4 shows a schematic diagram of an angle customization of a Micro OLED display assembly in an embodiment of the present disclosure.

As mentioned above, some display devices have angle customization requirements for the display assembly, and FIG. 4 shows a schematic diagram of angle customization of the Micro OLED display assembly. As can be seen in FIG. 4, the angle customization can match the light-emitting angle A and luminance at different positions of the display region 101 of the display assembly 100 with the requirements of the optical system 200 of the display device for the light-emitting angle and luminance, so as to achieve a better display effect, and the most notable effect is that the imaging luminance of the imaging system 300 can be more uniform, and the imaging quality can be improved.

The requirements of the optical system of the AR display device or the VR display device for the Micro OLED display assembly with angle customization are as follows: the angle corresponding to the maximum luminance diverges from the center of the display assembly to the edge of the display assembly, the angle corresponding to the maximum luminance is referred to as a chief ray angle (CRA), and the chief ray angle is approximately proportional to the distance from a position of the display assembly to the center of the display assembly.

Therefore, the light-emitting angle mentioned above can be set as the chief ray angle, and the chief ray angle is set to increase gradually from the center of the display assembly to the edge of the display assembly. The chief ray angle is the angle corresponding to the maximum luminance, and the widths of the first filter unit 41, the second filter unit 42 and the third filter unit 43 are calculated with the ratio of the red, green and blue light at this angle, which can eliminate the color deviation to the maximum extent. By designing in conjunction with angle customization, the color difference of the angle customization-based Micro OLED display assembly can be improved or even eliminated.

It should be noted that the above scheme can be used for both the improvement of the color deviation of the conventional Micro organic light-emitting diode (Micro OLED) display assembly and the improvement of the color deviation of the Micro OLED display assembly with angle customization. The improvement effect is better for the Micro OLED display assembly with angle customization.

Figure 5:
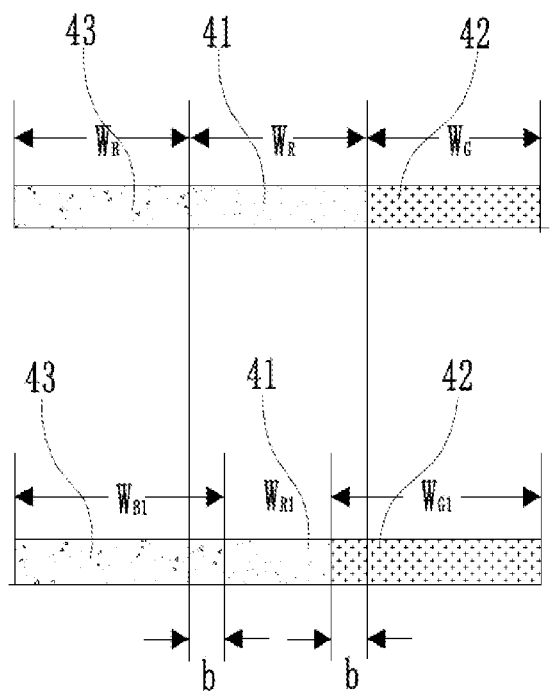
FIG. 5 shows a comparison diagram of a color filter module at the edge and at the center of a Micro OLED display assembly in an embodiment of the present disclosure.

As shown in FIG. 5, for the Micro OLED display assembly with angle customization, the chief ray angle thereof is approximately proportional to the distance from a position of the display assembly to the center of the display assembly. Based on this, it is contemplated to correlate the dimension variations of the first filter unit 41, the second filter unit 42 and the third filter unit 43 with the distance from the position of the display assembly to the center of the display assembly.

Specifically, the dimensions of the first filter unit 41, the second filter unit 42 and the third filter unit 43 between the center of the display assembly and the edge of the display assembly may be calculated in a proportional manner as follows:

the width of the first filter unit 41 at a position between the edge and the center is $$W_{R1} = W_R - \frac{2X}{L} \times 2b;$$

the width of the second filter unit 42 at the position between the edge and the center is $$W_{G1} = W_G + \frac{2X}{L} \times 2b;$$

the width of the third filter unit 43 at the position between the edge and the center is $$W_{B1} = W_B + \frac{2X}{L} \times 2b,$$

where X is a distance from the position to the center in a first direction, L is a width of the display assembly in the first direction, and b is half of a difference between the width of the first filter unit located at the edge and the width of the first filter unit located at the center.

It should be noted that the first direction here may be the horizontal direction in FIG. 2.

It is known that when the angle is 30° at the edge of the display assembly, $$W_{R1} = \frac{7}{10} W_R,$$

the width of the first filter unit 41 at the edge of the display assembly is wider than the width of the first filter unit 41 at the center of the display assembly by $$2b = \frac{3}{10} W_R,$$

where $W_G = W_R = W_B = \frac{1}{3}P$, and P is the dimension of a single pixel unit. At this time:

the width of the first filter unit 41 at a position between the edge and the center is $$W_{R1} = \left(1 - \frac{3X}{5L}\right) \times W_R;$$

the width of the second filter unit 42 at the position between the edge and the center is $$W_{G1} = W_G + \frac{3X}{5L} W_R;$$

and
the width of the third filter unit 43 at the position between the edge and the center is $$W_{B1} = W_B + \frac{3X}{5L} W_R.$$

It can be seen that the difference between the width of the first filter unit 41 located between the edge and the center and the width of the first filter unit 41 located at the center is proportional to the distance from the position between the edge and the center to the center. The difference between the width of the second filter unit 42 located between the edge and the center and the width of the second filter unit 42 located at the center is proportional to the distance from the position between the edge and the center to the center. The difference between the width of the third filter unit 43 located between the edge and the center and the width of the third filter unit 43 located at the center is proportional to the distance from the position between the edge and the center to the center.

If the ratio of red, green and blue light with 0° is 3:8:1, and the ratio of red, green and blue light with 30° is 3:10:1, the display assembly shows greener at a large viewing angle. Then, in order to ensure that the ratio of red, green and blue light with 30° is 3:8:1 at the edge of the display assembly, then:

$$\frac{3}{12} W_R = \frac{3}{14} W_{R1},$$

then $$W_{R1} = \frac{7}{6} W_R;$$

$$\frac{8}{12}W_G = \frac{10}{14}W_{G1},$$

then $$W_{G1} = \frac{14}{15}W_G;$$

$$\frac{1}{12}W_B = \frac{1}{14}W_{B1},$$

then $$W_{B1} = \frac{7}{6}W_B.$$

It is known that when the angle is 30° at the edge of the display assembly, $$W_{G1} = \frac{14}{15}W_G,$$

the width of the first filter unit 41 at the edge of the display assembly is wider than the width of the first filter unit 41 at the center of the display assembly by $$2b = \frac{1}{15}W_G,$$

where $W_G = W_R = W_B = \frac{1}{3}P$, and P is the dimension of a single pixel unit.

The dimension variations of the first filter unit 41, the second filter unit 42 and the third filter unit 43 are correlated with the distance from the position of the display assembly to the center of the display assembly. Specifically, the dimensions of the first filter unit 41, the second filter unit 42 and the third filter unit 43 between the center of the display assembly and the edge of the display assembly may be calculated in a proportional manner as follows:

the width of the first filter unit 41 at a position between the edge and the center is $$W_{R1} = W_R + \frac{2X}{15L}W_G;$$

the width of the second filter unit 42 at the position between the edge and the center is $$W_{G1} = \left(1 - \frac{2X}{15L}\right) \times W_G;$$

the width of the third filter unit 43 at the position between the edge and the center is $$W_{B1} = W_B + \frac{2X}{15L}W_G.$$

It can be seen that the difference between the width of the first filter unit 41 located between the edge and the center and the width of the first filter unit 41 located at the center is proportional to the distance from the position between the edge and the center to the center. The difference between the width of the second filter unit 42 located between the edge and the center and the width of the second filter unit 42 located at the center is proportional to the distance from the position between the edge and the center to the center. The difference between the width of the third filter unit 43 located between the edge and the center and the width of the third filter unit 43 located at the center is proportional to the distance from the position between the edge and the center to the center.

If the ratio of red, green and blue light with 0° is 3:8:1, and the ratio of red, green and blue light with 30° is 3:8:3, the display assembly shows bluer at a large viewing angle. Then, in order to ensure that the ratio of red, green and blue light with 30° is 3:8:1 at the edge of the display assembly, then:

$$\frac{3}{12}W_R = \frac{3}{14}W_{R1},$$

then $$W_{R1} = \frac{7}{6}W_R;$$

$$\frac{8}{12}W_G = \frac{8}{14}W_{G1},$$

then $$W_{G1} = \frac{7}{6}W_G;$$

$$\frac{1}{12}W_B = \frac{3}{14}W_{B1},$$

then $$W_{B1} = \frac{7}{18}W_B.$$

It is known that when the angle is 30° at the edge of the display assembly, $$W_{B1} = \frac{7}{18}W_B,$$

the width of the first filter unit 41 at the edge of the display assembly is wider than the width of the first filter unit 41 at the center of the display assembly by $$2b = \frac{11}{18}W_B,$$

where $W_G=W_R=W_B=\frac{1}{3}P$, and P is the dimension of a single pixel unit.

The dimension variations of the first filter unit 41, the second filter unit 42 and the third filter unit 43 are correlated with the distance from the position of the display assembly to the center of the display assembly. Specifically, the dimensions of the first filter unit 41, the second filter unit 42 and the third filter unit 43 between the center of the display assembly and the edge of the display assembly may be calculated in a proportional manner as follows:

the width of the first filter unit 41 at a position between the edge and the center is $$W_{R1} = W_R + \frac{11X}{9L}W_B;$$

the width of the second filter unit 42 at the position between the edge and the center is $$W_{G1} = W_G + \frac{11X}{9L}W_B;$$

the width of the third filter unit 43 at the position between the edge and the center is $$W_{B1} = \left(1 - \frac{11X}{9L}\right) \times W_B.$$

It can be seen that the difference between the width of the first filter unit 41 located between the edge and the center and the width of the first filter unit 41 located at the center is proportional to the distance from the position between the edge and the center to the center. The difference between the width of the second filter unit 42 located between the edge and the center and the width of the second filter unit 42 located at the center is proportional to the distance from the position between the edge and the center to the center. The difference between the width of the third filter unit 43 located between the edge and the center and the width of the third filter unit 43 located at the center is proportional to the distance from the position between the edge and the center to the center.

The micro-lens layer 6 includes a plurality of micro-lens structures 60, the micro-lens structure 60 is generally provided on a side of the plurality of color filter modules 40 away from the backplane 12. Each converging lens may correspond to one filter unit, and the orthographic projection of the filter unit on the backplane is located within the orthographic projection of the converging lens on the backplane.

Specifically, the micro-lens structure 60 includes a first converging lens 61, a second converging lens 62, and a third converging lens 63. For different color deviations, the widths of the first filter unit 41, the second filter unit 42, and the third filter unit 43 vary differently. The dimensions of the first converging lens 61, the second converging lens 62 and the third converging lens 63 are adaptively adjusted according to the dimension variations of the first filter unit 41, the second filter unit 42 and the third filter unit 43.

The orthographic projection of the converging lens corresponding to the first filter unit 41 on the backplane 12 gradually decreases from the center of the display assembly to the edge of the display assembly, and the orthographic projections of the converging lenses corresponding to the second filter unit 42 and the third filter unit 43 on the backplane 12 gradually increase from the center of the display assembly to the edge of the display assembly. Specifically, the orthographic projection of the first converging lens 61 on the backplane 12 gradually decreases from the center of the display assembly to the edge of the display assembly, and the orthographic projections of the second converging lens 62 and the third converging lens 63 on the backplane 12 gradually increase from the center of the display assembly to the edge of the display assembly.

In the case where the changes in the widths of the first filter unit 41, the second filter unit 42, and the third filter unit 43 are small, the orthographic projections of the converging lenses respectively corresponding to the first filter unit 41, the second filter unit 41 and the third filter unit 41 on the backplane 12 remain constant from the center of the display assembly to the edge of the display assembly. Specifically, the orthographic projection of each of the first converging lens 61, the second converging lens 62, and the third converging lens 63 on the backplane 12 remains constant from the center of the display assembly to the edge of the display assembly.

No matter how the first filter unit 41, the second filter unit 42 and the third filter unit 43 change, the orthographic projection of the first converging lens 61 on the backplane 12 is the same as the orthographic projection of the first filter unit 41 on the backplane 12, the orthographic projection of the second converging lens 62 on the backplane 12 is the same as the orthographic projection of the second filter unit 42 on the backplane 12, and the orthographic projection of the third converging lens 63 on the backplane 12 is the same as the orthographic projection of the third filter unit 43 on the backplane 12, which prevents color crosstalk during the display of the display assembly.

The first converging lens 61, the second converging lens 62 and the third converging lens 63 in the same micro-lens structure 60 have the same arch height d. The first converging lenses 61 in different micro-lens structures 60 have the same arch height d, the second converging lenses 62 in different micro-lens structures 60 have the same arch height d, and the third converging lenses 63 in different micro-lens structures 60 have the same arch height d. Although this causes the converging lenses above the filter units of different colors to have different morphologies, and the converging lenses of different morphologies have different light gathering capacities, as the converging lenses are microstructures, the converging lenses will not cause a large difference in the light gathering capacity, and a large difference in the ratio of red, green and blue chromatic dispersion. Therefore, the micro-lens structure 60 can be fabricated by coating, exposing, and developing, which is a simple and efficient fabrication method.

Figure 6:
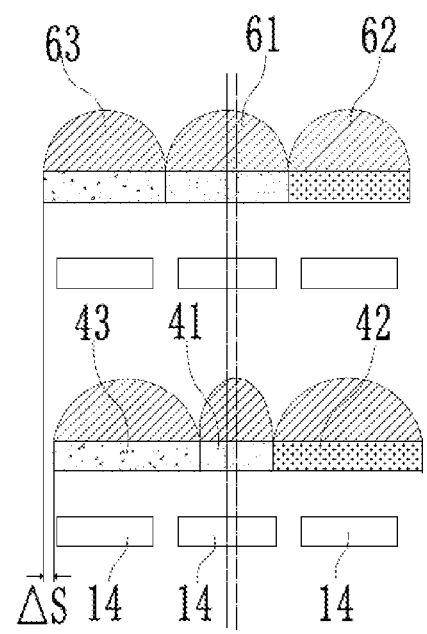
FIG. 6 shows a schematic diagram of the offset of a color filter module and a micro-lens structure of a Micro OLED display assembly in an embodiment of the present disclosure.

As shown in FIG. 6, in order to better improve the display effect of the display assembly, it may translate the color filter module 40 and the micro-lens structure 60 corresponding to each color filter module 40. The region at the edge of the display assembly and between the edge of the display assembly and the center of the display assembly becomes a changing region, and the orthographic projection, on the backplane 12, of the center of the filter unit in the changing region is not overlapped with the orthographic projection, on the backplane 12, of the center of the first electrode 14. The orthographic projection, on the backplane 12, of the center of the condensing lens in the changing region is not overlapped with the orthographic projection, on the backplane 12, of the center of the first electrode 14. Therefore, the display color difference of the display assembly at different light-emitting angles may be improved. It is to be understood that the orthographic projection of the center of the converging lens in the changing region on the backplane 12 and the orthographic projection of the center of the filter unit in the changing region on the backplane 12 may always be kept coincident.

Specifically, the orthographic projections of the centers of the first filter unit 41, the second filter unit 42 and the third filter unit 43 located in the changing region on the backplane 12 are not overlapped with the orthographic projections of the centers of the first electrodes 14 on the backplane 12. The orthographic projections of the centers of the first converging lens 61, the second converging lens 62 and the third converging lens 63 on the backplane 12 are not overlapped with the orthographic projections of the centers of the first electrodes 14 on the backplane 12.

By Taking that the customization angle is 30° at the edge of the display assembly as an example, an optical simulation may determine an offset ΔS of the color filter module 40 and the micro-lens structure 60 at the edge of the display assembly relative to the color filter module 40 and the micro-lens structure 60 at the center of the display assembly, which is strongly related to the distribution, with respect to the angle, of the luminous intensity of the light-emitting unit, and is strongly related to the relative dimensions of the light-emitting unit 16, the color filter layer 4 and the color filter module 40.

An embodiment of the present disclosure provides a display device that includes an optical system and any of the above described display assembles in the present disclosure, and light-emitting angles and luminance at different positions of the display assembly match requirements of the optical system for the light-emitting angle and the luminance. The structure of the display assembly has been described in detail above, and therefore will not be repeated herein. The beneficial effects of the display device may also be referred to as the beneficial effects of the display assembly.

The display device may be used in traditional electronic devices, such as mobile phones, computers, televisions, and camcorders, as well as emerging wearable devices, such as virtual reality devices and augmented reality devices, which are not listed herein.

The display device of the present disclosure may be used in virtual reality (VR) devices and augmented reality (AR) devices for emitting light to an optical path component of a near-eye display device in order to present an image. The display device of the present disclosure may be used in near-eye display devices such as virtual reality devices and augmented reality devices for emitting light to the optical path component of the near-eye display device so as to present an image. The detailed principles and structures of the near-eye display devices are not specifically limited herein, as long as the image display can be achieved.

The requirements of the optical system of the AR display device or the VR display device for the Micro OLED display assembly with angle customization are as follows: the light-emitting angle is the chief ray angle (CRA), and the chief ray angle gradually increase from the center of the display assembly to the edge of the display assembly.

It is to be noted that the display device may include other necessary components and compositions in addition to the display assembly and the optical system, for example, the display device may further include a housing, a circuit board, a power cord, and so on, which may be supplemented by a person skilled in the art according to the specific requirements for the use of the display device, and will not repeat the details herein.

Those skilled in the art may easily conceive of other embodiments of the present disclosure after considering the specification and practicing what is disclosed herein. The present application is intended to cover any variations, uses or adaptations of the present disclosure that follow the general principle of the present disclosure and include the common knowledge and the conventional technical means in the art that are not disclosed herein. The description and embodiments are considered to be exemplary only and the true scope and spirit of the present disclosure is indicated by the claims.

What is claimed is:

1. A display assembly, comprising:
   a backplane;
   a plurality of light-emitting units, provided on a side of the backplane; and
   a plurality of color filter modules, provided on a side of the plurality of light-emitting units away from the backplane, the color filter module comprising a plurality of filter units of different colors,
   wherein from a center of the display assembly to an edge of the display assembly, adjacent filter units of a same kind have different widths.

2. The display assembly according to claim 1, wherein the plurality of filter units comprises a first filter unit, a second filter unit and a third filter unit, and wherein in a cross-section perpendicular to the display assembly, widths of the first filter units gradually decrease from the center of the display assembly to the edge of the display assembly, widths of the second filter units gradually increase from the center of the display assembly to the edge of the display assembly, and widths of the third filter units gradually increase from the center of the display assembly to the edge of the display assembly.

3. The display assembly according to claim 1, wherein the plurality of filter units comprises a first filter unit, a second filter unit and a third filter unit, and wherein in a cross-section perpendicular to the display assembly, widths of the first filter units gradually decrease from the center of the display assembly to the edge of the display assembly, widths of the second filter units remain constant from the center of the display assembly to the edge of the display assembly, and widths of the third filter units remain constant from the center of the display assembly to the edge of the display assembly.

4. The display assembly according to claim 1, wherein the plurality of filter units comprises a first filter unit, a second filter unit and a third filter unit, and wherein in a cross-section perpendicular to the display assembly, widths of the first filter units remain constant from the center of the display assembly to the edge of the display assembly, widths of the second filter units gradually increase from the center of the display assembly to the edge of the display assembly, and widths of the third filter units gradually increase from the center of the display assembly to the edge of the display assembly.

5. The display assembly according to claim 2, wherein the widths of the first filter units located at the edge and between the edge and the center are $$W_{R1} = \frac{(r_1+g_1+b_1)r}{(r+g+b)r_1}W_R;$$

the widths of the second filter units located at the edge and between the edge and the center are $$W_{G1} = \frac{(r_1+g_1+b_1)g}{(r+g+b)g_1}W_G;$$

the widths of the third filter units located at the edge and between the edge and the center are $$W_{B1} = \frac{(r_1+g_1+b_1)b}{(r+g+b)b_1}W_B,$$

wherein $W_R$ is the width of the first filter unit located at the center, $W_G$ is the width of the second filter unit located at the center, $W_B$ is the width of the third filter unit located at the center, r is a luminance of light of a first color with a 0° light-emitting angle at the center, g is a luminance of light of a second color with the 0° light-emitting angle at the center, b is a luminance of light of a third color with the 0° light-emitting angle at the center, $W_{R1}$ is the width of the first filter unit located at the edge, $W_{G1}$ is the width of the second light filter unit located at the edge, $W_{B1}$ is the width of the second filter unit located at the edge, $r_1$ is the luminance of light of the first color with a light-emitting angle at the edge and between the edge and the center, $g_1$ is the luminance of light of the second color with the light-emitting angle at the edge and between the edge and the center, and $b_1$ is the luminance of light of the third color with the light-emitting angle at the edge and between the edge and the center.

6. The display assembly according to claim 5, wherein the width of the first filter unit at a position between the edge and the center is $$W_{R1} = W_R - \frac{2X}{L} \times 2b,$$

wherein X is a distance from the position to the center in a first direction, L is a width of the display assembly in the first direction, and b is half of a difference between the width of the first filter unit located at the edge and the width of the first filter unit located at the center.

7. The display assembly according to claim 5, wherein the width of the second filter unit at a position between the edge and the center is $$W_{G1} = W_G + \frac{2X}{L} \times 2b;$$

the width of the third filter unit at the position between the edge and the center is $$W_{B1} = W_B + \frac{2X}{L} \times 2b,$$

wherein X is a distance from the position to the center in a first direction, L is a width of the display assembly in the first direction, and b is half of a difference between the width of the first filter unit located at the edge and the width of the first filter unit located at the center.

8. The display assembly according to claim 2, wherein the light-emitting unit comprises a first electrode, a light-emitting layer and a second electrode, the first electrode is provided on a side of the backplane, the light-emitting layer is provided on a side of the first electrode away from the backplane, the second electrode is provided on a side of the light-emitting layer away from the backplane, the backplane comprises a plurality of switching units, and the switching unit is connected to the first electrode.

9. The display assembly according to claim 8, wherein a plurality of the light-emitting units comprises a plurality of first electrodes, an orthographic projection of the first filter unit on the backplane and orthographic projections of the plurality of first electrodes on the backplane form a first overlapping portion, and widths of the first overlapping portions remain constant from the center of the display assembly to the edge of the display assembly, orthographic projections, on the backplane, of the second filter unit and the third filter unit and the orthographic projections of the plurality of first electrodes on the backplane form a second overlapping portion, and widths of the second overlapping portions gradually increase from the center of the display assembly to the edge of the display assembly.

10. The display assembly according to claim 2, wherein the display assembly further comprises:

a plurality of converging lenses, provided on a side of the plurality of color filter modules away from the backplane, each of the converging lens corresponding to one of the filter units, and an orthographic projection of the filter unit on the backplane being located within an orthographic projection of a corresponding converging lens on the backplane.

11. The display assembly according to claim 10, wherein orthographic projections, on the backplane, of the converging lenses corresponding to the first filter units gradually decrease from the center of the display assembly to the edge of the display assembly, orthographic projections, on the backplane, of the converging lenses corresponding to the second filter units gradually increase from the center of the display assembly to the edge of the display assembly, and orthographic projections, on the backplane, of the converging lenses corresponding to the third filter units gradually increase from the center of the display assembly to the edge of the display assembly.

12. The display assembly according to claim 10, wherein orthographic projections, on the backplane, of the converging lenses corresponding to the first filter units, the second filter units and the third filter units remain constant from the center of the display assembly to the edge of the display assembly.

13. The display assembly according to claim 10, wherein arch heights of the converging lenses corresponding to different filter units are same.

14. The display assembly according to claim 8, wherein a region at the edge of the display assembly and between the edge of the display assembly and the center of the display assembly is a changing region, and wherein an orthographic projection, on the backplane, of a center of the filter unit in the changing region is not overlapped with an orthographic projection, on the backplane, of a center of the first electrode.

15. The display assembly according to claim 8, wherein a region at the edge of the display assembly and between the edge of the display assembly and the center of the display assembly is a changing region, and wherein an orthographic projection, on the backplane, of a center of the condensing lens in the changing region is not overlapped with an orthographic projection, on the backplane, of a center of the first electrode.

16. The display assembly according to claim 2, wherein the first filter unit, the second filter unit and the third filter unit, which are adjacent to each other, form one pixel, and wherein in a cross-section perpendicular to the display assembly, a total width of a plurality of the pixels is constant.

17. The display assembly according to claim 2, wherein the first filter unit is a red film, the second filter unit is a green film, and the third filter unit is a blue film.

18. The display assembly according to claim 1, wherein the backplane is a monocrystalline silicon integrated circuit.

19. A display device, comprising a display assembly and an optical system,
- wherein the display assembly comprises a backplane; a plurality of light-emitting units, provided on a side of the backplane; and a plurality of color filter modules, provided on a side of the plurality of light-emitting units away from the backplane, the color filter module comprising a plurality of filter units of different colors,
- wherein from a center of the display assembly to an edge of the display assembly, adjacent filter units of a same kind have different widths
- wherein light-emitting angles and luminance at different positions of the display assembly match requirements of the optical system for the light-emitting angle and the luminance.

20. The display device according to claim 19, wherein the display device is used for an AR device or a VR device.

* * * * *